United States Patent [19]

Mills

[11] Patent Number: 5,791,498

[45] Date of Patent: Aug. 11, 1998

[54] RACK MOUNT MECHANISM HAVING AN ANGLED BAR-NUT

[75] Inventor: Richard S. Mills, Austin, Tex.

[73] Assignee: Dell U.S.A., L.P., Round Rock, Tex.

[21] Appl. No.: 786,056

[22] Filed: Jan. 21, 1997

[51] Int. Cl.$^6$ ........................................ A47F 7/00
[52] U.S. Cl. ..................... 211/26; 211/183; 403/354; 312/140; 312/223.2
[58] Field of Search ............................ 211/26, 191, 192, 211/183; 52/656.1; 403/353, 354; 361/807, 829, 724; 312/223.2, 223.1, 140

[56] References Cited

U.S. PATENT DOCUMENTS

| | | | |
|---|---|---|---|
| 3,986,318 | 10/1976 | McConnell | 211/192 X |
| 4,103,852 | 8/1978 | Fisk | 248/178 |
| 4,407,416 | 10/1983 | Anderson | 211/183 X |
| 4,505,392 | 3/1985 | Erlam | 211/26 |
| 4,861,183 | 8/1989 | Loos | 403/354 |
| 4,988,008 | 1/1991 | Blum et al. | 312/140 X |
| 5,105,953 | 4/1992 | Finnegan | 211/183 |
| 5,165,770 | 11/1992 | Hahn | 211/26 X |
| 5,350,074 | 9/1994 | Rosenband | 211/192 |
| 5,579,621 | 12/1996 | Fang | 52/656.1 X |
| 5,579,924 | 12/1996 | Sands et al. | 211/26 |

*Primary Examiner*—Peter M. Cuomo
*Assistant Examiner*—Robert J. Sandy
*Attorney, Agent, or Firm*—Skjerven, Morrill, MacPherson, Franklin & Friel, LLP; Stephen A. Terrile

[57] ABSTRACT

The present invention provides a rack mount mechanism that includes first and second recessed slides fixed in a stationary position and first and second mounting brackets slideably mounted on the first and second recessed slides, respectively. The first and second mounting brackets each have front and back ends extending, for example, perpendicularly inward from the base of the mounting brackets. A frame is included which is attachable to the computer enclosure and has front and back rails. Each rail has an edge extending, for example, perpendicularly outward from the base of the rail and each edge has a plurality of apertures. An angled bar-nut is coupled to each of the rails by threading the angled portion of each angled bar-nut through an aperture in the edge of the rail and including a screw and a cage nut to secure the angled portion of each angled bar-nut to the edge of each rail. The front and back ends of the first and second mounting brackets are positioned between and coupled to each angled bar-nut and the edge of the front and back rails, respectively.

12 Claims, 5 Drawing Sheets

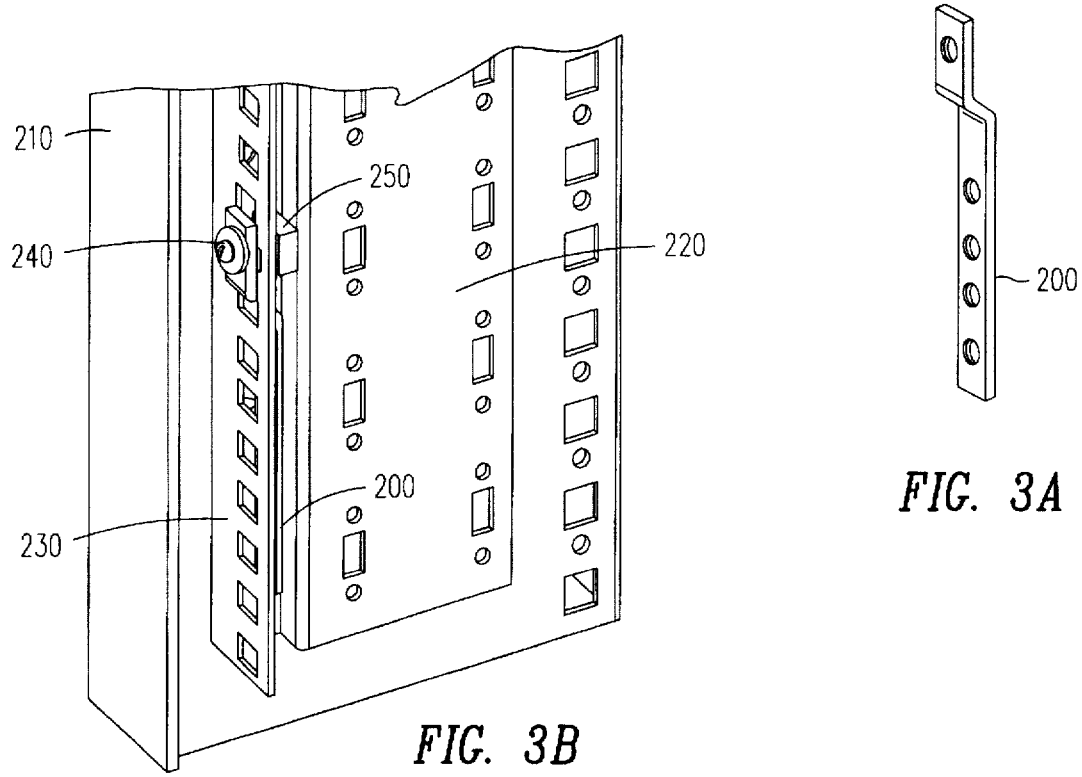
FIG. 3A
FIG. 3B
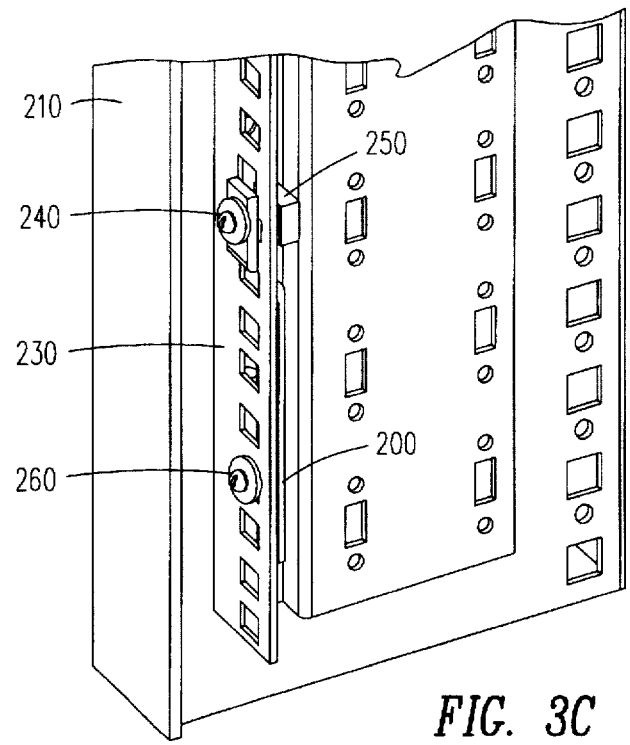
FIG. 3C

RACK MOUNT MECHANISM HAVING AN ANGLED BAR-NUT

BACKGROUND OF THE INVENTION

Field of the Invention

This invention relates to electronic equipment enclosures, particularly, computer enclosures, and more specifically to mounting computer enclosures in a rack.

Description of the Related Art

A rack is a compartment that can contain a number of electronic equipment or computer enclosures. A number of vendors sell standard EIA (Electronic Industries Association) racks on the market. These EIA racks are used to house many different types of electronics including telephone equipment and computers. In order to meet the EIA specification, certain limitations must be placed on the size of the computer enclosure or chassis. If the chassis size is limited, then assembly into the rack is fairly simple using standard slides and cage nuts that snap into the rack. However, a chassis with a greater width may still be used if the chassis is mounted using recessed slides. Recessing the slides allows for more room for the chassis width, however, assembly then becomes more difficult because the cage nuts are no longer used.

The current solution to mounting recessed slides is a bar-nut 110, a flat piece of metal with threaded holes in it, that is shown, for example in FIG. 1A (prior art). FIGS. 1B and 1C (prior art) illustrate the components required to assemble a standard recessed slide in a rack (the figures illustrate a partial front assembly, however, the remainder of the front assembly and the back assembly are essentially the same for all figures). The rack 150 includes a front rail 160 and a back rail (not shown this figure). A recessed slide 120 having a tray (not shown this figure) attachable to the computer enclosure or chassis and a mounting bracket 130 slideably mounted on the recessed slide 120 are also included. An edge 140 of the mounting bracket 130 is placed between the rack's 150 rail 160 and the bar-nut 110. The rail 160 includes a number of apertures to accommodate screws used to secure the mounting bracket 130. A screw 170 and washer is run through the rail 160 and into the bar-nut 110. An additional screw with a washer (not shown) may also be used in a lower aperture of the rail 160.

The first problem with the current solution is difficulty of assembly. It requires at least two people to assemble the recessed slide, wherein one person must hold the loose end of the recessed slide while the other holds the end of the recessed slide to be assembled, the bar-nut and the screw with the washer. The screw has to be lined up with the hole in the front rail, the mounting bracket, and the bar-nut. This is quite difficult to accomplish especially given the limited amount of space to assemble. The second problem with the current solution is that the recessed slide is actually held in place by friction since the aperture in the front rail is a large clearance hole. This makes it very difficult to position the slides in the rack. There is approximately one sixteenth (1/16) of an inch between each chassis installed in the rack. If the exact location of the chassis is missed, the chassis will interfere with other equipment above or below it. Therefore, several iterations are usually required to locate the slides in the exact position in the rack. Accordingly, a rack mount mechanism is needed that can be simply, accurately and securely assembled

SUMMARY OF THE INVENTION

Accordingly, the rack mount mechanism of the present invention has the advantages of simplifying and expediting assembly of the mechanism and for accurately positioning a computer enclosure or chassis into a rack. The present invention provides a rack mount mechanism that includes first and second recessed slides having a tray located between the recessed slides, the tray being attachable to the computer enclosure. First and second mounting brackets are slideably mounted on the first and second recessed slides, respectively. The first and second mounting brackets each have front and back ends extending, for example, perpendicularly outward from the base of the mounting brackets. The rack has front and back rails and each rail has an edge extending, for example, perpendicularly inward from the base of the rail and each edge has a plurality of apertures.

An angled bar-nut having threaded holes is coupled to each of the rails by threading the angled portion of each angled bar-nut through an aperture in the edge of the rail. A screw and a cage nut secure the angled portion of each angled bar-nut to the edge of each rail. The front and back ends of the first and second mounting brackets are positioned between and coupled to each angled bar-nut and the edge of the front and back rails, respectively. The front and back ends of the first and second mounting brackets are configured, for instance, with slots for sliding into position between each angled bar-nut and the edge of the front and back rails and are secured by one or more screws.

BRIEF DESCRIPTION OF THE DRAWINGS

The present invention may be better understood, and its numerous objects, features, and advantages made apparent to those skilled in the art by referencing the accompanying drawings.

FIG. 3A is a perspective view of an angled bar-nut as used in the present invention;

FIGS. 3B and 3C shows the angled bar-nut illustrated in FIG. 3A coupled to the rack according to the present invention.

DESCRIPTION OF THE PREFERRED EMBODIMENT(S)

Figure 1A:
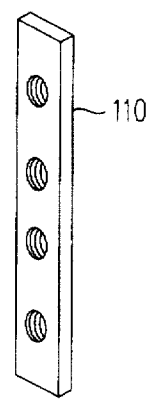
FIG. 1A (prior art) is a perspective view of a bar-nut.
Figure 1B:
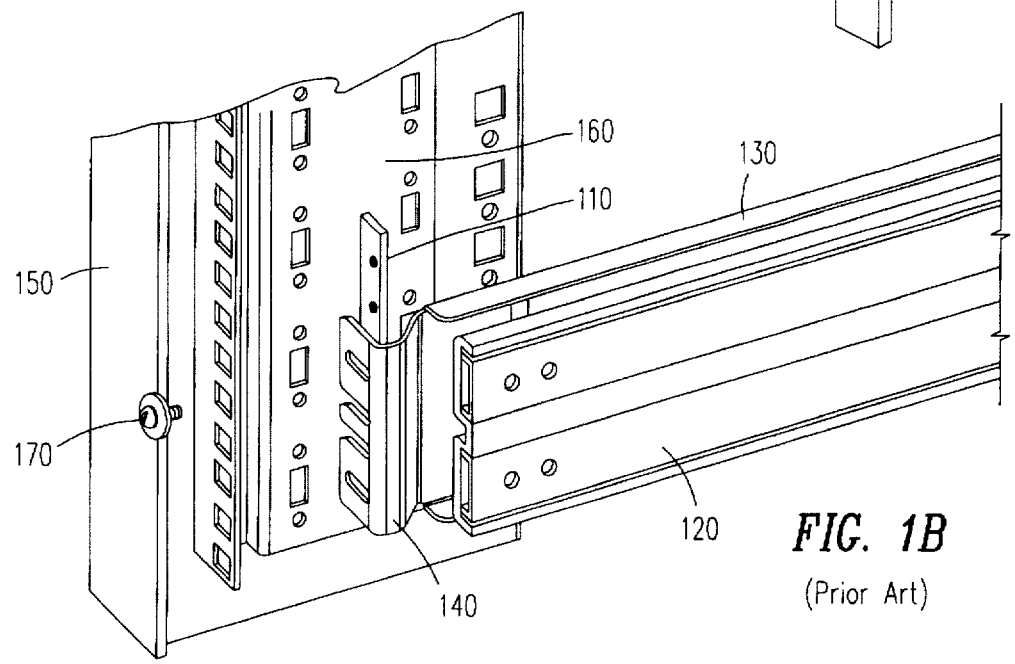
FIGS. 1B and 1C (prior art) illustrate partial views of a rack mounting mechanism using the bar-nut illustrated in FIG. 1A.
Figure 1C:
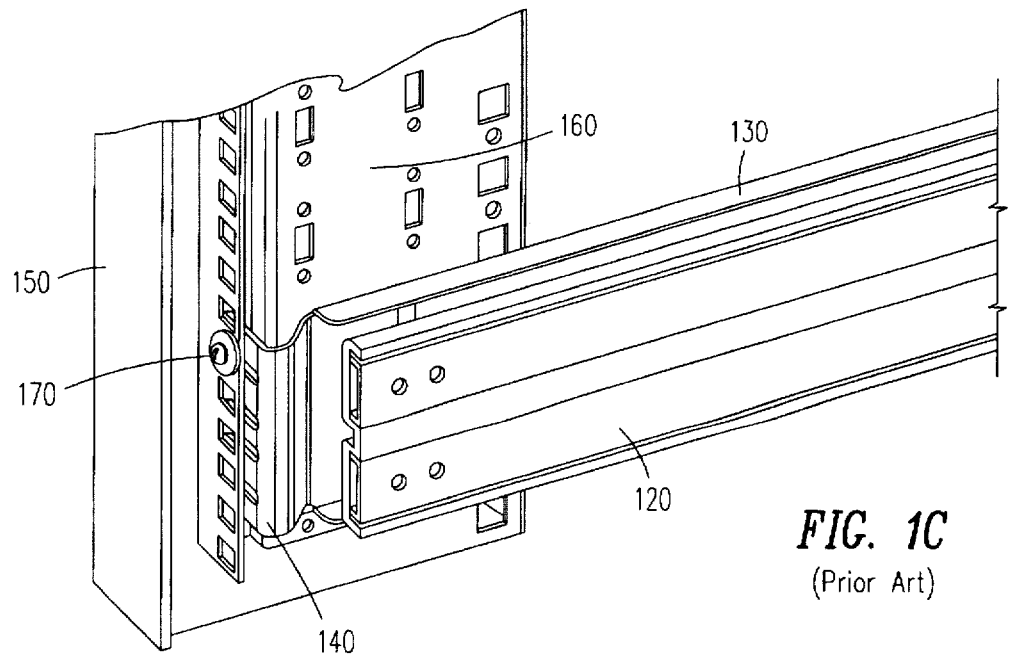
Figure 2A:
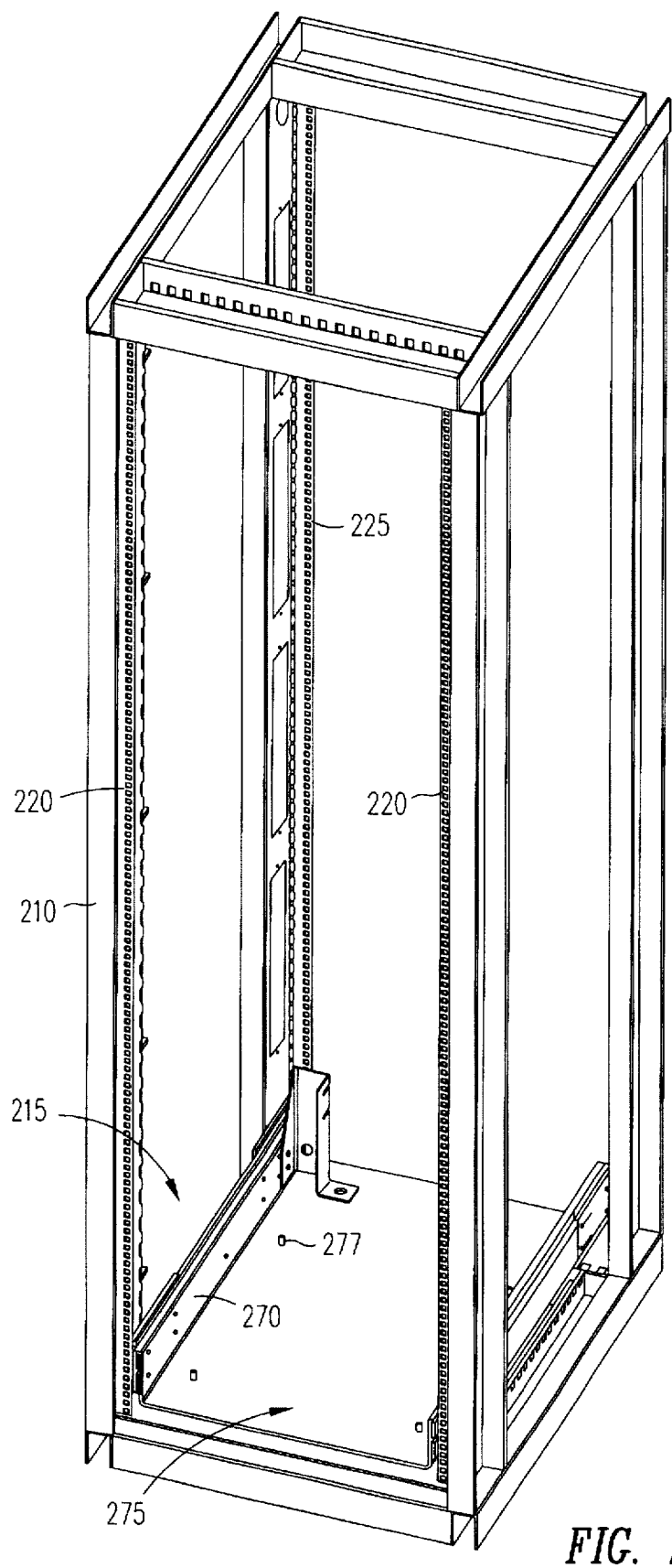
FIGS. 2A and 2B illustrate a rack and a rack mounted computer system according to the present invention.
Figure 2B:
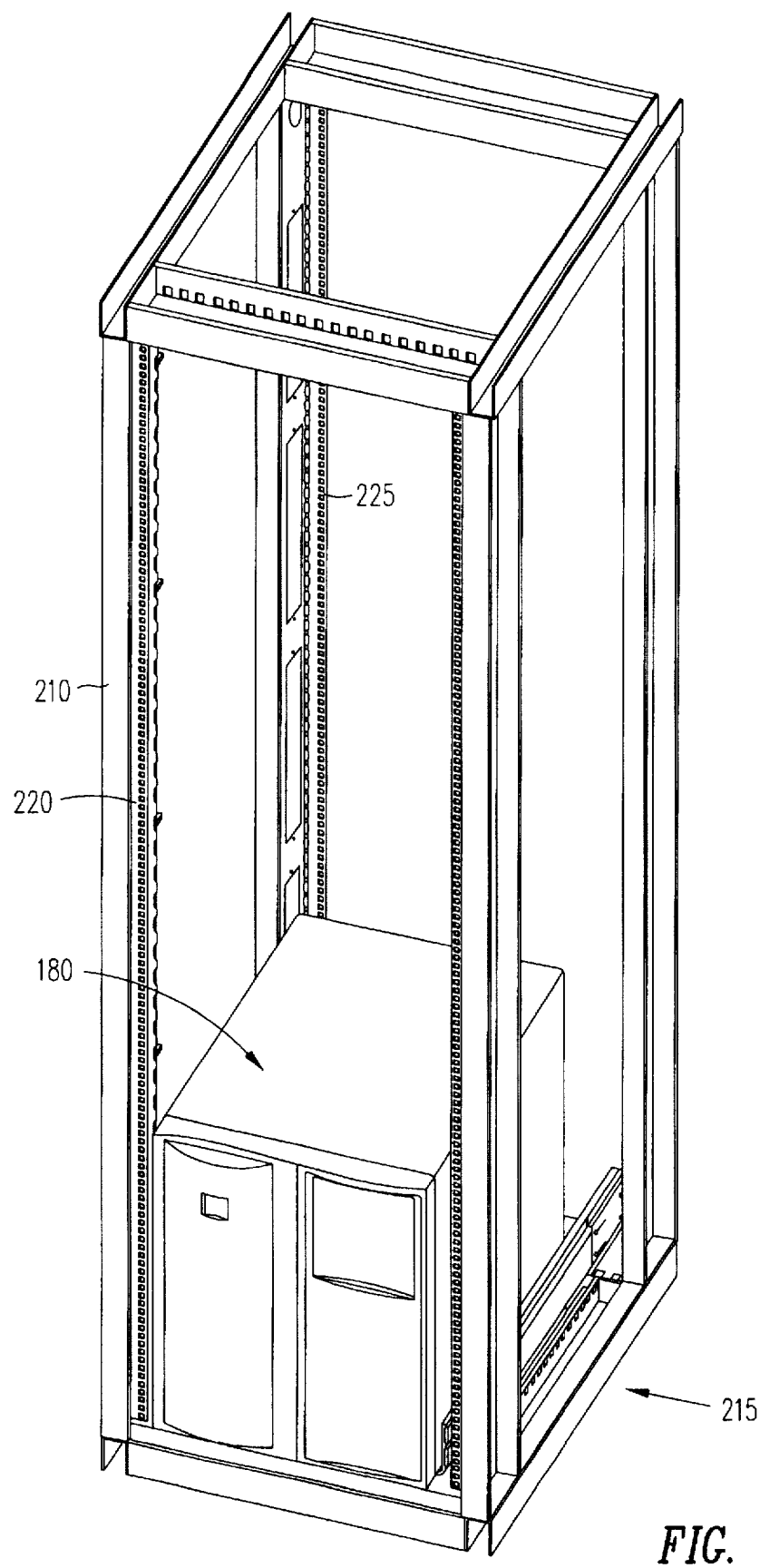

A rack mounted computer system of the present invention is shown in FIG. 2. Computer enclosure 180 is mounted horizontally in rack 210 using the rack mount mechanism of the present invention. FIG. 3A illustrates an angled bar-nut 200 having threaded holes as used in the rack mount mechanism of the present invention.

Referring now to FIG. 3B and 3C, a partial view of the rack 210 including a frame 215 with a front rail 220 is shown. The frame 215 is attachable to the electronic equipment enclosure, such as, for example, a computer enclosure (shown in FIG. 2) and includes front and back rails(the following figures illustrate only a portion of a front rail 220 and assembly, however, the back rail and assembly are essentially the same). Each rail 220 has an edge 230 which includes a plurality of apertures. The edge 230 of the rail 220, for example, extends perpendicularly outward from the base of the rail 220. An angled bar-nut 200 is coupled to each rail 220 by threading the angled portion of each angled bar-nut 200 through an aperture in the edge 230 of the rail 220. A screw 240 and a cage nut 250 secure the angled portion of each angled bar-nut 200 to the edge 230 of each rail 220. A second screw 260 and washer may also be used, for instance, through the bottom threaded hole of the angled bar-nut 200 to additionally secure the angled bar-nut 200 to the rail 220 and to facilitate and expedite assembly.

Figure 4A:
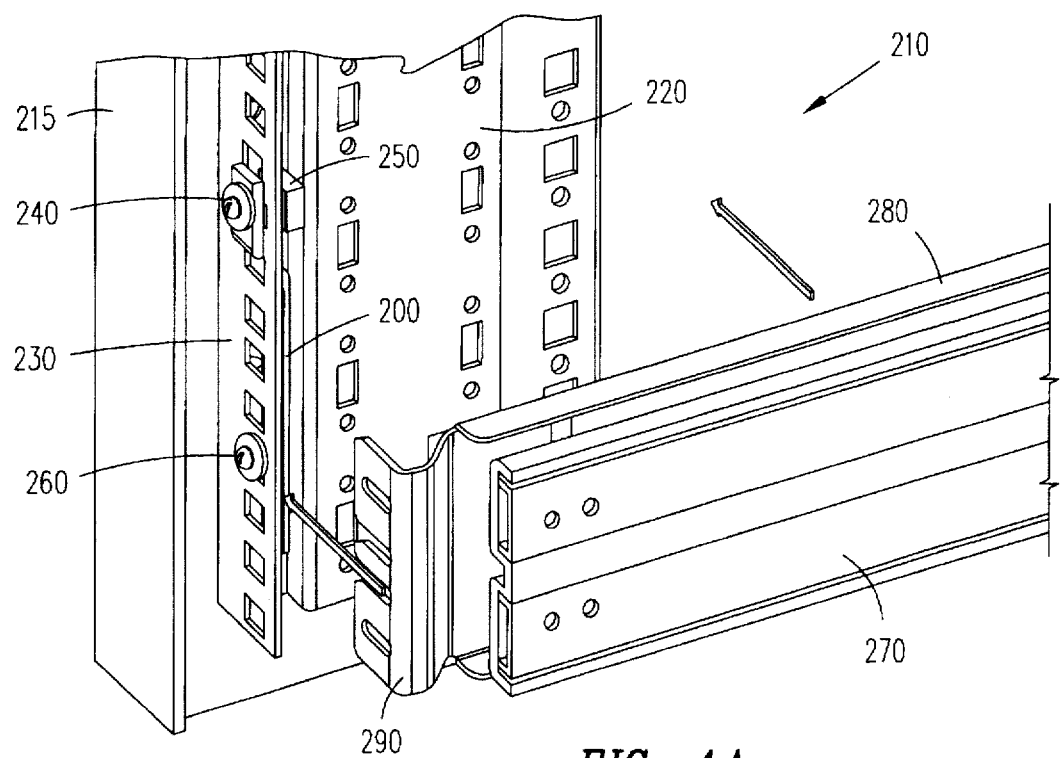
FIGS. 4A and 4B illustrate partial views of the rack mounting mechanism according to the present invention using the angled bar-nut illustrated in FIG. 3A. The use of the same reference symbols in different drawings indicates similar or identical items.
Figure 4B:
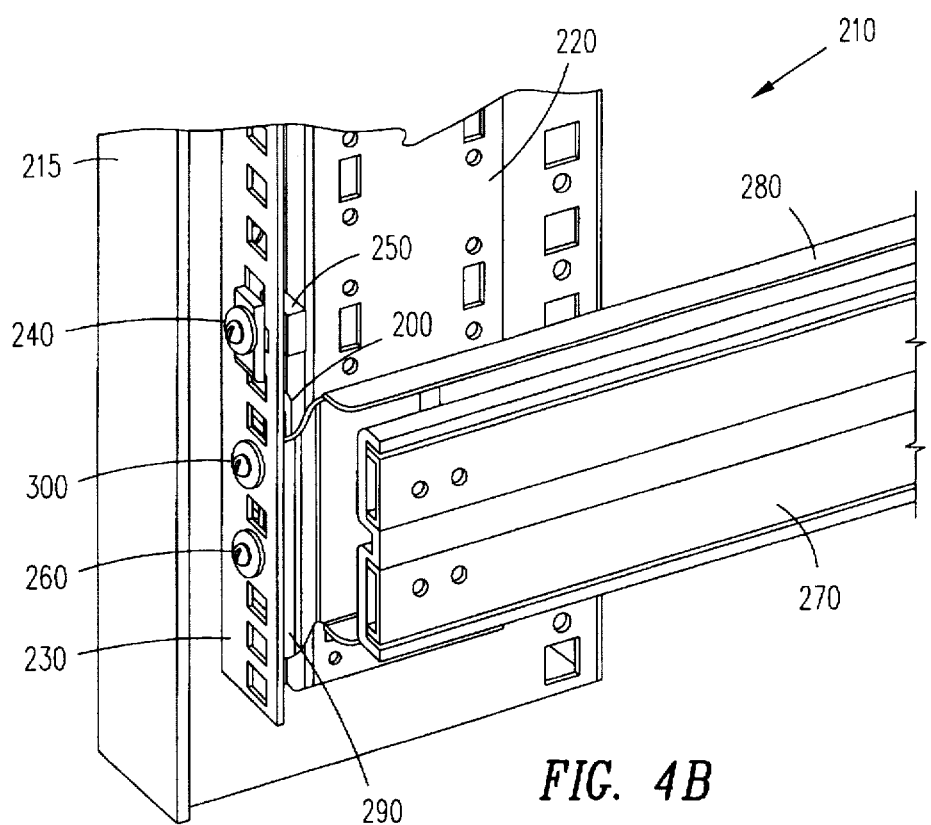

FIGS. 4A and 4B illustrate the completed assembly of the rack mount mechanism of the present invention including a recessed slide 270, located on opposite sides of the rack 210 and fixed in a stationary position, and a mounting bracket 280 slideably mounted on each recessed slide 270. Each mounting bracket 280 includes a front end 290 and a back end (not shown) extending, for example, perpendicularly inward from the base of the mounting bracket 280. The front end 290 and back end of the mounting brackets 280 include slots, for instance, for inserting into position between the angled bar-nut 200 and the edge 230 of the front rail 220 and back rail (not shown), respectively. The mounting bracket 280 is coupled to the angled bar-nut 200 and the rail 220 by a screw 300 and washer which is run through an aperture in the edge 230 of the rail 220, the end 290 of the mounting bracket 280 and a threaded hole in the angled bar-nut 200.

The rack mounting mechanism and method of assembly of the present invention solves the problems of difficulty of assembly and positioning of the chassis in a rack using recessed slides. The rack mount mechanism simplifies and expedites assembly of the mounting mechanism by using the angled bar-nut 200 coupled to each rail 220 by threading the angled portion of each angled bar-nut 200 through an aperture in the edge 230 of the rail 220 and attaching a screw 240 and a cage nut 250 to secure the angled portion of the angled bar-nut 200. A second screw 260 is attached to each angled bar-nut 200 through a second aperture in the edge 230 of the rail 220. The end 290 of the mounting bracket 280 is inserted into position between the angled bar-nut 200 and the edge 230 of the rail 220. A third screw 300 is attached to each angled bar-nut 200 through a third aperture in the edge 230 of the rail 220 and through the end 290 of the mounting bracket 280 wherein the computer enclosure is mounted in the rack 210.

The rack mounting mechanism of the present invention, therefore changes a difficult two person assembly into a simple and quick one person assembly. The use of the angled bar-nut 200 facilitates positioning of the mounting brackets 280 and recessed slides 270. The additional use of the cage nut 250 facilitates centering of the angled bar-nut 200 and recessed slides 270 so that no iterations are required to align the comuper enclosure in the rack 210.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A rack mount mechanism for an electronic equipment enclosure comprising:

first and second recessed slides fixed in a stationary position;

first and second mounting brackets slideably mounted on the first and second recessed slides, respectively, the first and second mounting brackets each having front and back ends;

a frame attachable to the electronic equipment enclosure and having front and back rails, each rail having an edge and each edge including a plurality of apertures; and an angled bar-nut coupled to each rail by threading the angled portion of each angled bar-nut through an aperture in the edge of the rail and wherein the front and back ends of the first and second mounting brackets are positioned between and coupled to each angled bar-nut and the edge of the front and back rails, respectively.

2. The rack mount mechanism as recited in claim 1 further comprising:

a screw and a cage nut securing the angled portion of each angled bar-nut to the edge of the rail.

3. The rack mount mechanism as recited in claim 1 wherein the front and back ends of the first and second mounting brackets extend perpendicularly inward from the base of the mounting brackets and wherein each edge of the front and back rails extends perpendicularly outward from the base of the rail.

4. The rack mount mechanism as recited in claim 3 wherein the front and back ends of the first and second mounting brackets are configured with slots for inserting into position between each angled bar-nut and the edge of the front and back rails, respectively.

5. The rack mount mechanism as recited in claim 4 wherein the front and back ends of the mounting brackets are coupled to each angled bar-nut and the edges of the rails by one or more screws.

6. A rack mount mechanism for a computer enclosure comprising:

first and second recessed slides fixed in a stationary position;

first and second mounting brackets slideably mounted on the first and second recessed slides, respectively, the first and second mounting brackets each having front and back ends extending perpendicularly inward from the base of the mounting brackets;

a frame attachable to the computer enclosure and having front and back rails, each rail having an edge extending perpendicularly outward from the base of the rail, and each edge including a plurality of apertures; and an angled bar-nut coupled to each rail by threading the angled portion of each angled bar-nut through an aperture in the edge of the rail and including a screw and a cage nut to secure the angled portion of each angled bar-nut to the edge of the rail and wherein the front and back ends of the first and second mounting brackets are positioned between and coupled to each angled bar-nut and the edge of the front and back rails, respectively.

7. The rack mount mechanism as recited in claim 6 wherein the front and back ends of the first and second mounting brackets are configured with slots for inserting into position between each angled bar-nut and the edge of the front and back rails, respectively, and wherein the mounting brackets are coupled to each angled bar-nut and the edges of the rails by one or more screws.

8. A rack mounted computer system comprising:

a computer enclosure;

a rack mounting mechanism securing the computer enclosure, the rack mounting mechanism including, first and second recessed slides fixed in a stationary position;

first and second mounting brackets slideably mounted on the first and second recessed slides, respectively, the first and second mounting brackets each having front and back ends extending perpendicularly inward from the base of the mounting brackets;

a frame attachable to the computer enclosure and having front and back rails, each rail having an edge extending perpendicularly outward from the base of the rail, and each edge including a plurality of apertures; and an angled bar-nut coupled to each rail by threading the angled portion of each angled bar-nut through an aperture in the edge of the rail and wherein the front and back ends of the first and second mounting brackets are positioned between and coupled to each angled bar-nut and the edge of the front and back rails, respectively.

9. The rack mounted computer system as recited in claim 8 further comprising:

a screw and a cage nut securing the angled portion of each angled bar-nut to the edge of the rail.

10. The rack mounted computer system as recited in claim 8 wherein the front and back ends of the first and second mounting brackets are configured with slots for inserting into position between each angled bar-nut and the edge of the front and back rails, respectively.

11. The rack mounted computer system as recited in claim 10 wherein the front and back ends of the mounting brackets are coupled to each angled bar-nut and to the edge of the rails by one or more screws.

12. A method of mounting a computer enclosure in a rack, the rack including first and second recessed slides fixed in a stationary position, first and second mounting brackets slideably mounted on the first and second recessed slides, respectively, the first and second mounting brackets each having front and back ends, and a frame having front and back rails, each rail having an edge with a plurality of apertures, the frame being attached to the computer enclosure, comprising the steps of:

coupling an angled bar-nut to each rail by threading the angled portion of each angled bar-nut through an aperture in the edge of the rail and attaching a first screw and a cage nut to secure the angled portion of each angled bar-nut to the edge of the rail;

attaching a second screw to each angled bar-nut through a second aperture in the rail;

inserting the front and back ends of the mounting brackets between each angled bar-nut and the edge of the front and back rails, respectively; and attaching a third screw to each angled bar-nut through a third aperture in the edge of the rail and through the end of each mounting bracket wherein the computer enclosure is mounted in the rack.

* * * * *